United States Patent
Chang et al.

(10) Patent No.: US 7,224,427 B2
(45) Date of Patent: May 29, 2007

(54) MEGASONIC IMMERSION LITHOGRAPHY EXPOSURE APPARATUS AND METHOD

(75) Inventors: Ching-Yu Chang, I-Lan (TW);
Chien-Hung Lin, Hsin-Chu (TW);
Chin-Hsiang Lin, Hsin-chu (TW);
David Lu, Hsin-chu (TW);
Horng-Huei Tseng, Hsin chu (TW);
Burn-Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 118 days.

(21) Appl. No.: 10/910,480

(22) Filed: Aug. 3, 2004

(65) Prior Publication Data
US 2006/0028626 A1 Feb. 9, 2006

(51) Int. Cl.
*G03B 27/52* (2006.01)
(52) U.S. Cl. ............... 355/30; 355/53; 355/67
(58) Field of Classification Search ........... 355/30, 355/67
See application file for complete search history.

(56) References Cited

U.S. PATENT DOCUMENTS

| 5,610,683 | A * | 3/1997 | Takahashi | 355/53 |
| 2004/0247790 | A1 * | 12/2004 | Moriyama | 427/256 |
| 2005/0048223 | A1 * | 3/2005 | Pawloski et al. | 427/600 |
| 2005/0134817 | A1 * | 6/2005 | Nakamura | 355/53 |
| 2005/0225734 | A1 * | 10/2005 | De Smit et al. | 355/30 |

* cited by examiner

*Primary Examiner*—D. Rutledge
(74) *Attorney, Agent, or Firm*—Haynes and Boone, LLP

(57) ABSTRACT

A megasonic immersion lithography exposure apparatus and method for substantially eliminating microbubbles from an exposure liquid in immersion lithography is disclosed. The apparatus includes an optical system for projecting light through a mask and onto a wafer.

An optical transfer chamber is provided adjacent to the optical system for containing an exposure liquid. At least one megasonic plate operably engages the optical transfer chamber for inducing sonic waves in and eliminating microbubbles from the exposure liquid.

31 Claims, 4 Drawing Sheets

MEGASONIC IMMERSION LITHOGRAPHY EXPOSURE APPARATUS AND METHOD

FIELD OF THE INVENTION

The present invention relates to photolithography processes used in the formation of integrated circuit (IC) patterns on photoresist in the fabrication of semiconductor integrated circuits. More particularly, the present invention relates to a megasonic immersion lithography exposure apparatus and method in which immersion liquid is subjected to megasonic waves to obliterate bubbles from the liquid during a lithography exposure step.

BACKGROUND OF THE INVENTION

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

In a common IC fabrication technique known as a dual damascene technique, lower and upper dielectric layers are sequentially deposited on a substrate. A via opening is patterned and etched in the lower dielectric layer, and a trench opening is patterned and etched in the upper dielectric layer. At each step, a patterned photoresist layer is used to etch the trench and via openings in the corresponding dielectric layer. A conductive copper line is then formed in the trench and via openings, typically using electrochemical plating (ECP) techniques, to form the horizontal and vertical IC circuit interconnects on the substrate.

Photoresist materials are coated onto the surface of a wafer, or onto a dielectric or conductive layer on a wafer, by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

During the photolithography step of semiconductor production, light energy is applied through a reticle or mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

Spin coating of photoresist on wafers, as well as the other steps in the photolithographty process, is carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

The circuit pattern defined by the developed and hardened photoresist is next transferred to an underlying metal layer using an etching process, in which metal in the metal layer not covered by the cross-linked photoresist is etched away from the wafer with the metal under the cross-linked photoresist that defines the device feature protected from the etchant. Alternatively, the etched material may be a dielectric layer in which via openings and trench openings are etched according to the circuit pattern, such as in a dual damascene technique. The via and trench openings are then filled with a conductive metal such as copper to define the metal circuit lines. As a result, a well-defined pattern of metallic microelectronic circuits, which closely approximates the cross-linked photoresist circuit pattern, is formed on the wafer.

One type of lithography which is used in the semiconductor fabrication industry is immersion lithography, in which an exposure apparatus includes a mask and lens which are provided over an optical transfer chamber. A water-containing exposure liquid is distributed through the optical transfer chamber. In operation, the optical transfer chamber is placed over an exposure field on a photoresist-coated wafer. As the exposure liquid is distributed through the optical transfer chamber, light is transmitted through the mask, lens and exposure liquid in the optical transfer chamber, respectively, and onto the photoresist of the exposure field. The circuit pattern image in the mask is therefore transferred by the light transmitted through the exposure liquid to the photoresist. The exposure liquid in the optical transfer chamber enhances the resolution of the transmitted circuit pattern image on the photoresist.

Prior to distribution of the exposure liquid through the optical transfer chamber, the aqueous liquid is typically de-gassed to remove most of the microbubbles from the liquid. However, some of the microbubbles remain in the liquid during its distribution through the optical transfer chamber. These remaining microbubbles have a tendency to adhere to the typically hydrophobic surface of the photoresist, thereby distorting the circuit pattern image projected onto the photoresist. Accordingly, an apparatus and method is needed to substantially obliterate microbubbles in an exposure liquid during immersion lithography in order to prevent distortion of the circuit pattern image projected onto the photoresist in an exposure field.

SUMMARY OF THE INVENTION

Some embodiments of the present invention are generally directed to a novel megasonic immersion lithography exposure apparatus for substantially eliminating microbubbles from an exposure liquid before, during or both before and during immersion lithography. In one embodiment, the apparatus includes an optical transfer chamber which is positioned over a resist-covered wafer, an optical housing which is fitted with a photomask and lens provided over the optical transfer chamber, and an inlet conduit for distributing an immersion liquid into the optical transfer chamber. At least one megasonic plate operably engages the inlet conduit to perpetuate sonic waves through the immersion liquid as the liquid is distributed through the inlet conduit and into the optical transfer chamber. The sonic waves substantially obliterate microbubbles in the exposure liquid such that the liquid enters the optical transfer chamber in a substantially bubble-free state for the exposure step. In another embodiment, the apparatus includes an annular megasonic plate which encircles the optical transfer chamber.

The present invention is further directed to a method for substantially eliminating microbubbles in an exposure liquid used in an immersion lithography process for transferring a circuit pattern image from a mask or reticle to a resist-covered wafer. The method includes propagating sound waves through an exposure liquid before, during or both before and during distribution of the exposure liquid through an optical transfer chamber of an immersion lithography exposure apparatus. The sound waves substantially obliterate microbubbles in the exposure liquid and remove microbubbles from the resist surface, thereby preventing microbubbles from adhering to the resist on the surface of a wafer and distorting the circuit pattern image transferred from the apparatus, through the exposure liquid and onto the resist.

The present invention is further directed to a method for substantially eliminating microbubbles and particle from exposure lens used in an immersion lithography process for transferring a circuit pattern image from a mask or reticle to a resist-covered wafer. The method includes propagating sound waves through an exposure liquid before, during or both before and during distribution of the exposure liquid through an optical transfer chamber of an immersion lithography exposure apparatus. The method also includes changing the exposure liquid before, during or both before and during exposure process. The sound waves substantially obliterate microbubbles and particles on the lens surface, thereby preventing microbubbles and particle from adhering to the surface of a emersion lens and distorting the circuit pattern image transferred from the apparatus, through the exposure liquid and onto the resist.

The present invention is further directed to an immersion lithography process. In one embodiment, the process includes providing a substrate into an immersion lithography system and providing a fluid through an inlet conduit. Sonic waves are propagated toward the fluid at the inlet conduit. The substrate is exposed by transmitting radiation through the immersion lithography system, through the fluid, and towards the substrate.

BRIEF DESCRIPTION OF THE DRAWINGS

The invention will now be described, byway of example, with reference to the accompanying drawings, in which.

DETAILED DESCRIPTION OF THE INVENTION

Figure 1:
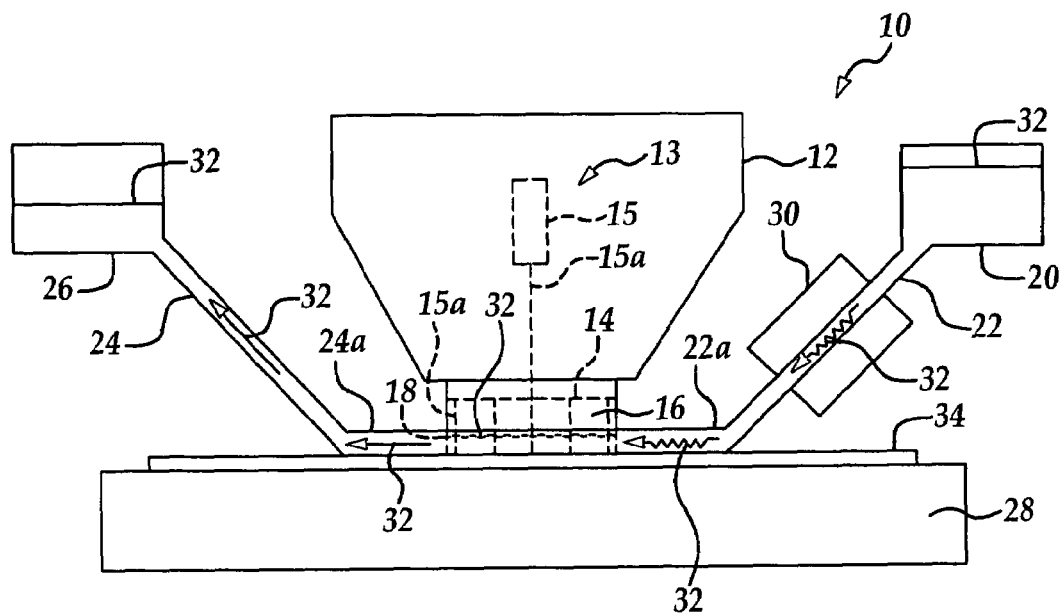
FIG. 1 is a schematic view of a megasonic immersion lithography apparatus according to a first embodiment of the present invention.

The present invention contemplates a novel megasonic immersion lithography exposure apparatus for substantially eliminating microbubbles from an exposure liquid before, during, or both before and during immersion lithography. In one embodiment, the apparatus includes an optical housing which is fitted with a photomask and a lens. An optical transfer chamber is provided beneath the lens of the optical housing. An inlet conduit is provided in fluid communication with the optical transfer chamber to distribute an immersion liquid into the chamber. At least one megasonic plate operably engages the inlet conduit to perpetuate sonic waves through the immersion liquid as the liquid is distributed through the inlet conduit and into the optical transfer chamber. In another embodiment, an annular megasonic plate encircles the optical transfer chamber of the apparatus.

In operation of the apparatus, the optical transfer chamber is positioned over an exposure field on a photoresist-coated wafer. The sonic waves generated by the megasonic plate or plates substantially obliterate microbubbles in the exposure liquid, such that the liquid enters the optical transfer chamber in a substantially bubble-free state. During the exposure step, light is transmitted through the photomask and lens, respectively, of the optical housing; through the exposure liquid in the optical transfer chamber; and onto the photoresist coated onto the wafer. The exposure liquid, substantially devoid of microbubbles, transmits the substantially distortion-free circuit pattern image onto the photoresist with high resolution.

The present invention is further directed to a method for substantially eliminating microbubbles in an exposure liquid used in an immersion lithography process exposure step to transfer a circuit pattern image from a mask or reticle to an exposure field on a resist-covered wafer. In a first embodiment, the method includes propagating sound waves through an exposure liquid to obliterate microbubbles in the liquid before the exposure step. In a second embodiment, the method includes propagating sound waves through the exposure liquid both before and during the exposure step. In a third embodiment, the method includes intermittently propagating sound waves through the exposure liquid during the exposure step. The megasonic power applied by the megasonic plate or plates to the exposure liquid is preferably about 10~1,000 kHz.

Any of a variety of exposure liquids are suitable for the megasonic immersion lithography method of the present invention. In one embodiment, the exposure liquid includes $NH_4$, $H_2O_2$ and $H_2O$ in a concentration by volume ratio of typically about 1:1:10~1:1:1000. In another embodiment, the exposure liquid includes $NH_4$ and $H_2O$ in a concentration by volume ratio of typically about 1:10~1:1000. In still another embodiment, the exposure liquid is deionized (DI) water. In yet another embodiment, the exposure liquid is ozonated ($O_3$) water, having an ozone concentration of typically about 1~1000 ppm. The exposure liquid may include a non-ionic surfactant, an anionic surfactant or a cationic surfactant having a concentration in the range of typically about 1~1000 ppm.

Referring initially to FIG. 1, a megasonic immersion lithography exposure apparatus, hereinafter exposure apparatus, of the present invention is generally indicated by reference numeral 10. The exposure apparatus 10 includes a wafer stage 28 for supporting a wafer 34 having a photoresist layer (not shown) deposited thereon. An optical housing 12 contains an optical system having a laser (not shown) and the last objective lens 16 which is positioned above the wafer stage 28. A mask or reticle (not shown) is removably inserted in the optical housing 12, above the lens 16. The mask or reticle includes a circuit pattern (not shown) which is to be transmitted onto the photoresist layer on the wafer 34 during a lithography process, which will be hereinafter described. An optical transfer water immersion chamber 18 is provided beneath the last objective lens 16 and is disposed above the wafer stage 28. During lithography, the laser beam through the mask or reticle, which produces a circuit pattern image that is transmitted through the last objective lens 16 and the optical transfer water immersion chamber 18, respectively, and onto the wafer 34.

An inlet liquid reservoir 20, from which extends an inlet conduit 22, contains a supply of exposure liquid 32. A discharge conduit 22a extends from the inlet conduit 22 and is provided in fluid communication with the optical transfer chamber 18. An outlet liquid reservoir 26 is provided in fluid communication with the optical transfer chamber 18 through a collecting conduit 24a and an outlet conduit 24, respectively. According to the present invention, a megasonic plate 30 is provided on the inlet conduit 22, according to the knowledge of those skilled in the art, to generate sonic waves (not shown) in the exposure liquid 32 as the liquid 32 is distributed through the inlet conduit 22.

In operation of the exposure apparatus 10, as hereinafter further described, the exposure liquid 32 is distributed from the inlet liquid reservoir 20, through the inlet conduit 22 and discharge conduit 22a, respectively, and into the optical transfer water immersion chamber 18. The megasonic plate 30 generates sonic waves (not shown) in the exposure liquid 32, obliterating all or most of the microbubbles in the exposure liquid 32. The laser beam from the optical housing 12 which produces a circuit pattern image is transmitted through the lens last objective 16 and exposure liquid 32 contained in the optical transfer water immersion chamber 18, respectively, and is projected onto the photoresist coated on the wafer 34. The exposure liquid 32 is continuous pumped from the optical transfer water immersion chamber 18, through the collecting conduit 24a and outlet conduit 24, respectively, and into the outlet liquid reservoir 26.

Figure 3A:
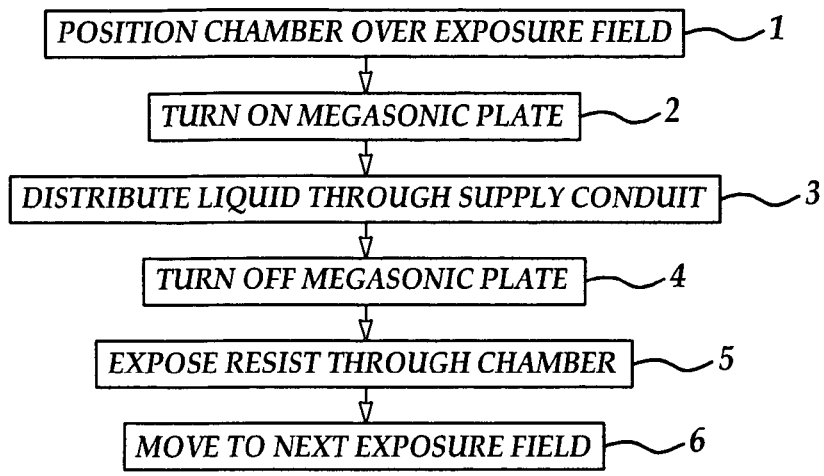
FIG. 3A is a flow diagram which illustrates sequential process steps carried out according to a first embodiment of the method of the present invention.
Figure 3B:
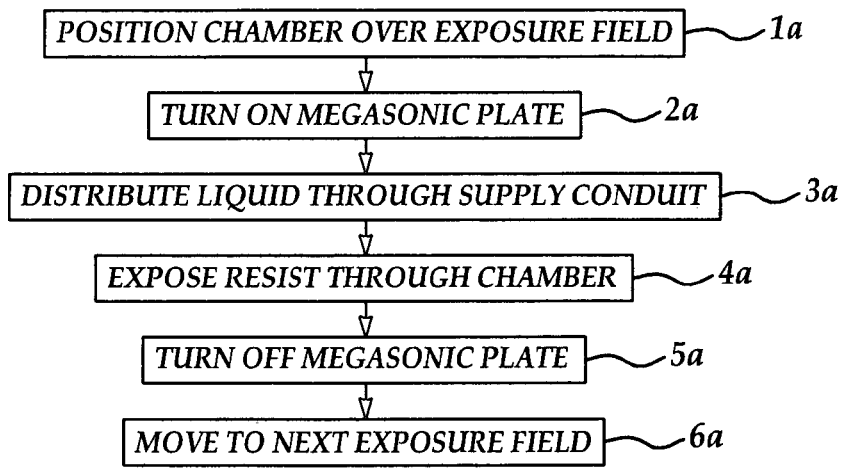
FIG. 3B is a flow diagram which illustrates sequential process steps carried out according to a second embodiment of the method of the present invention.
Figure 3C:
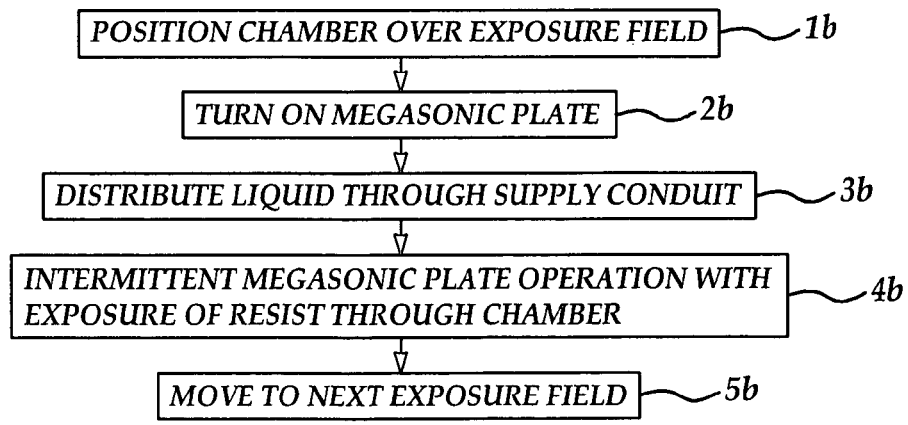
FIG. 3C is a flow diagram which illustrates sequential process step carried out according to a third embodiment of the method of the present invention.

Referring next to FIGS. 3A–3C, in conjunction with FIG. 1, the exposure apparatus 10 can be operated according to one of three modes. According to the flow diagram of FIG. 3A, the optical transfer water immersion chamber 18 is initially positioned over an exposure field on the wafer 34, as indicated in step 1. The megasonic plate 30 is then turned on (step 2), followed by distribution of the exposure liquid 32 from the inlet liquid reservoir 20, through the inlet conduit 22 and into the optical transfer water immersion chamber 18, respectively (step 3). As the exposure liquid 32 passes through the inlet conduit 22, the megasonic plate 30 induces the formation of sonic waves in the exposure liquid 32. The sonic waves obliterate microbubbles in the exposure liquid 32, such that the exposure liquid 32 is substantially devoid of microbubbles upon entry into the optical transfer chamber 18, Furthermore, the sonic waves also obliterate the microbubbles on the resist surface through the sonic wave transfer from discharge conduit 22a to optical transfer water immersion chamber 18.

As indicated in step 4, the megasonic plate 30 is turned off prior to exposing the exposure field on the wafer 34 to the circuit pattern image transmitted through the exposure liquid 32 (step 5), the exposure liquid 32 transmits a high-resolution circuit pattern image which is undistorted by microbubbles onto the surface of the photoresist on the wafer 34. After completion of the exposure step 5, the optical transfer chamber 18 is moved to the next exposure field on the wafer 34 and steps 1–5 are repeated, as indicated in step 6.

According to the flow diagram of FIG. 3B, the optical transfer water immersion chamber 18 is initially positioned over an exposure field on the wafer 34, as indicated in step 1a. The megasonic plate 30 is then turned on (step 2a), followed by distribution of the exposure liquid 32 from the inlet liquid reservoir 20, through the inlet conduit 22 and into the optical transfer water immersion chamber 18, respectively (step 3a). The sonic waves generated by the megasonic plate 30 obliterate microbubbles in the exposure liquid 32 passing through the inlet conduit 22, such that the exposure liquid 32 is substantially devoid of microbubbles upon entry into the optical transfer chamber 18 and the microbubbles adhered on the wafer 34 is therefore obliterate.

As indicated in step 4a, while the megasonic plate 30 remains on, the photoresist on the wafer 34 is exposed. Accordingly, during the exposure step (step 4a), the megasonic plate 20 continues to obliterate microbubbles in the exposure liquid 32 and on the wafer resist surface 34. The circuit pattern image transmitted from the optical housing 12 through the optical transfer chamber 18 is therefore undistorted by microbubbles and is projected onto the surface of the photoresist on the wafer 34 with a high resolution. After completion of the exposure step 4a, the megasonic plate 30 may be turned off (step 5a). The optical transfer chamber 18 is then moved to the next exposure field on the wafer 34 and steps 1–5 are repeated, as indicated in step 6a.

According to the flow diagram of FIG. 3C, the optical transfer chamber 18 is initially positioned over an exposure field on the wafer 34, as indicated in step 1b. The megasonic plate 30 is then turned on (step 2b), and the exposure liquid 32 is distributed from the inlet liquid reservoir 20, through the inlet conduit 22 and into the optical transfer chamber 18, respectively (step 3b). The sonic waves generated by the megasonic plate 30 obliterate microbubbles in the exposure liquid 32 and on the wafer resist surface 34, such that the exposure liquid 32 is substantially devoid of microbubbles upon entry into the optical transfer chamber 18 and adhesion on top of the resist surface 34.

As indicated in step 4b, the exposure step is carried out while the megasonic plate 30 is intermittently turned on and off. Accordingly, during exposure of the wafer 34, the megasonic plate 20 continues to obliterate microbubbles in the exposure liquid 32. After completion of the exposure step 4b, the optical transfer chamber 18 is moved to the next exposure field on the wafer 34 and steps 1–5 are repeated, as indicated in step 5b.

Figure 3D:
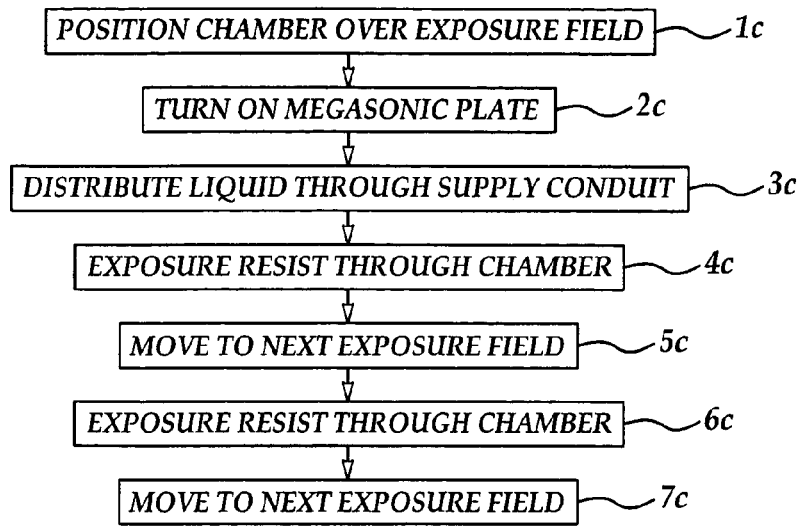
FIG. 3D is a flow diagram which illustrates sequential process step carried out according to a fourth embodiment of the method of the present invention.

According to the flow diagram of FIG. 3D, the optical transfer water immersion chamber 18 is initially positioned over an exposure field on the wafer 34, as indicated in step 1c. The megasonic plate 30 is then turned on (step 2c), followed by distribution of the exposure liquid 32 from the inlet liquid reservoir 20, through the inlet conduit 22 and into the optical transfer water immersion chamber 18, respectively (step 3c). The sonic waves generated by the megasonic plate 30 obliterate microbubbles in the exposure liquid 32 passing through the inlet conduit 22, such that the exposure liquid 32 is substantially devoid of microbubbles upon entry into the optical transfer chamber 18 and the microbubbles adhered on the wafer 34 is therefore obliterate.

As indicated in step 4c, while the megasonic plate 30 remains on, the photoresist on the wafer 34 is exposed. Accordingly, during the exposure step (step 4c), the megasonic plate 20 continues to obliterate microbubbles in the exposure liquid 32 and on the wafer resist surface 34. The circuit pattern image transmitted from the optical housing 12 through the optical transfer chamber 18 is therefore undistorted by microbubbles and is projected onto the surface of the photoresist on the wafer 34 with a high resolution. After completion of the exposure step 4a, the megasonic plate 30 may be still turned on. The optical transfer chamber 18 is then moved to the next exposure field on the wafer 34 and steps 4c–5c are repeated, as indicated in step 6c.

Figure 3E:
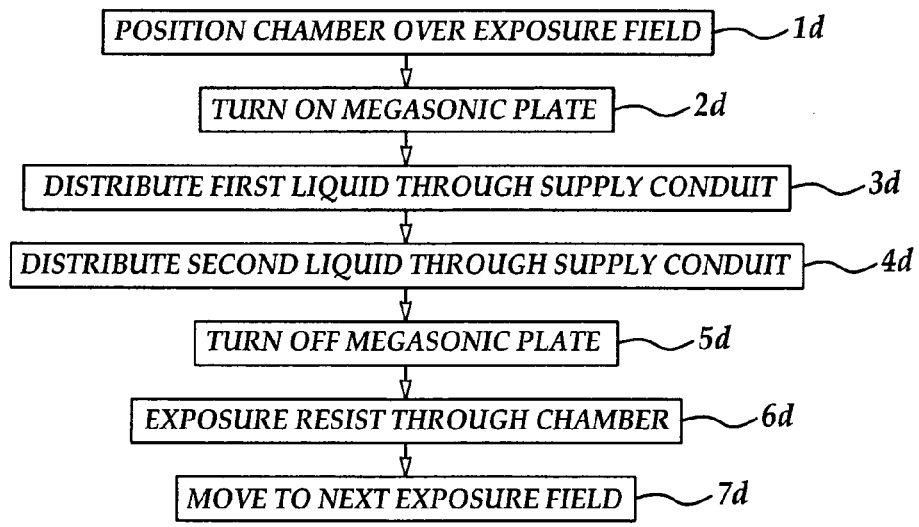
FIG. 3E is a flow diagram which illustrates sequential process step carried out according to a fifth embodiment of the method of the present invention.
Figure 3F:
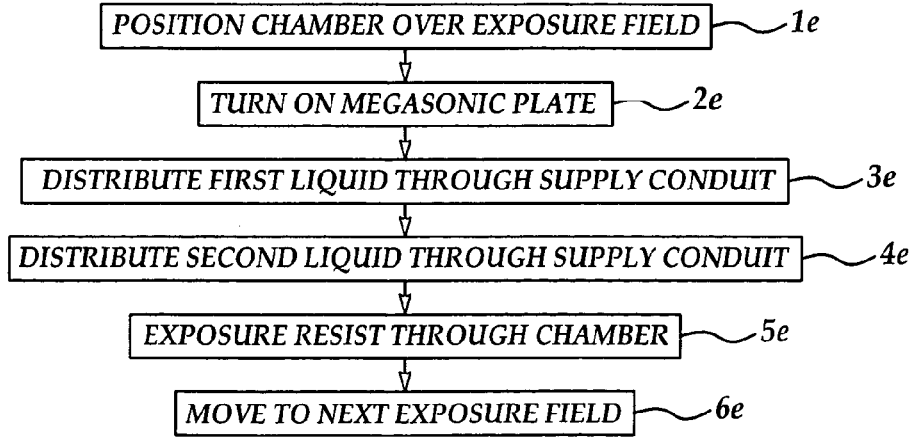
FIG. 3F is a flow diagram which illustrates sequential process step carried out according to a sixth embodiment of the method of the present invention.
Figure 4:
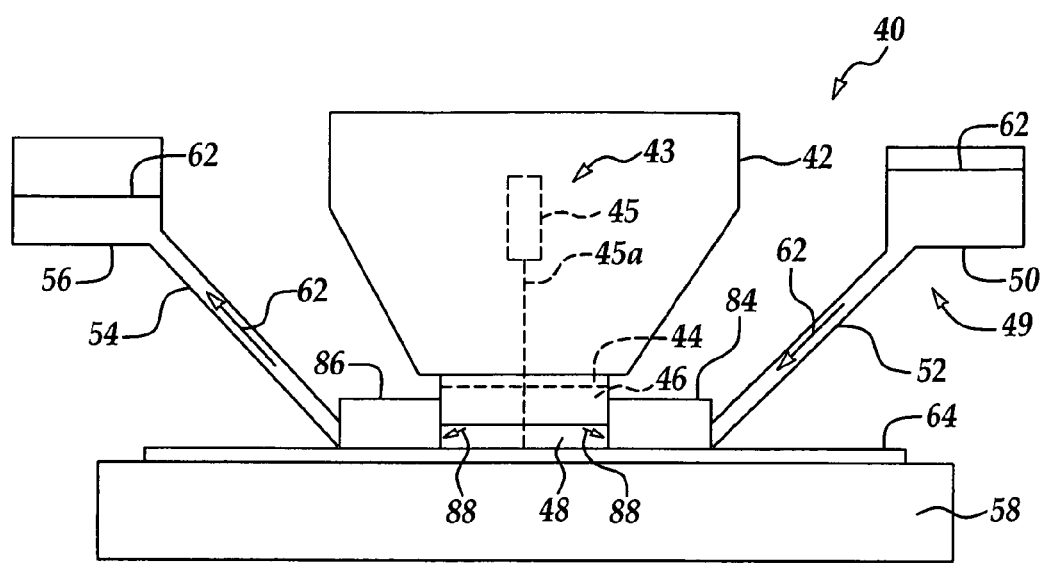
FIG. 4 is a schematic view of a megasonic immersion lithography apparatus provided with an objective lens auto-clean mechanism according to the present invention.

According to the flow diagram of FIG. 3E, the optical transfer water immersion chamber 18 is initially positioned over an exposure field on the wafer 34, as indicated in step 1d. The megasonic plate 30 is then turned on (step 2d), followed by distribution of the first liquid 32 from the inlet liquid reservoir 20, through the inlet conduit 22 and into the optical transfer water immersion chamber 18, respectively (step 3d). The sonic waves generated by the megasonic plate 30 obliterate microbubbles in the exposure liquid 32 passing through the inlet conduit 22 and removing particle on the low surface of the last objective lens 108, such that the exposure liquid 32 is substantially devoid of microbubbles upon entry into the optical transfer chamber 18 and the particles adhered on the low surface of the last objective lens 108 is therefore obliterate.

As indicated in step 4D, while the megasonic plate 30 remains on, followed by distribution of the second liquid from the inlet liquid reservoir 20, through the inlet conduit 22 and into the optical transfer water immersion chamber 18 to replace the first liquid (step 4d), the photoresist on the wafer 34 is exposed. Accordingly, during the exposure step (step 6d), the megasonic plate does not turn on (step 5d). The circuit pattern image transmitted from the optical housing 12 through the optical transfer water immersion chamber 18 is therefore undistorted by particles and is projected onto the surface of the photoresist on the wafer 34 with a high resolution. After completion of the exposure step 6d, the optical transfer chamber 18 is then moved to the next exposure field on the wafer 34 and steps 6d–7d are repeated, as indicated in step 6d.

According to the flow diagram of FIG. 3E, the optical transfer water immersion chamber 18 is initially positioned over an exposure field on the wafer 34, as indicated in step 1d. The megasonic plate 30 is then turned on (step 2d), followed by distribution of the first liquid 32 from the inlet liquid reservoir 20, through the inlet conduit 22 and into the optical transfer water immersion chamber 18, respectively (step 3d). The sonic waves generated by the megasonic plate 30 obliterate microbubbles in the exposure liquid 32 passing through the inlet conduit 22 and removing particle on the low surface of the last objective lens 16, such that the exposure liquid 32 is substantially devoid of microbubbles upon entry into the optical transfer chamber 18 and the particles adhered on the low surface of the last objective lens 16 is therefore obliterate.

As indicated in step 4e, while the megasonic plate 30 remains on, followed by distribution of the second liquid from the inlet liquid reservoir 20, through the inlet conduit 22 and into the optical transfer water immersion chamber 18 to replace the first liquid (step 4e), the photoresist on the wafer 34 is exposed. Accordingly, during the exposure step (step 5e), the megasonic plate still turn on (step 2e). The circuit pattern image transmitted from the optical housing 12 through the optical transfer water immersion chamber 18 is therefore undistorted by particles and is projected onto the surface of the photoresist on the wafer 34 with a high resolution. After completion of the exposure step 5e, the optical transfer chamber 18 is then moved to the next exposure field on the wafer 34 and steps 5e–6e are repeated, as indicated in step 5e.

Figure 2:
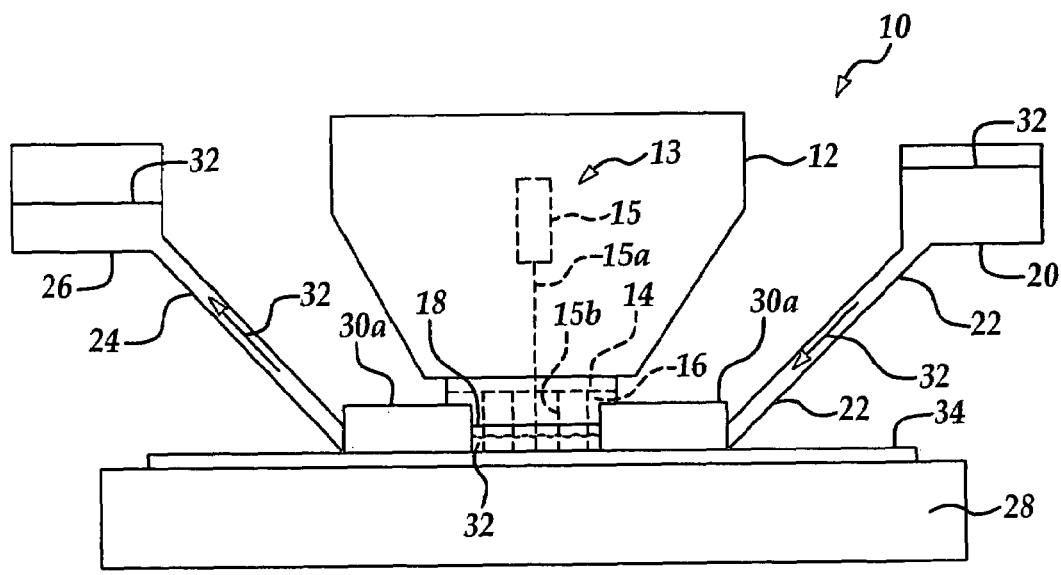
FIG. 2 is a schematic view of a megasonic immersion lithography apparatus according to a second embodiment of the present invention.

Referring next to FIG. 2, in an alternative embodiment of the exposure apparatus, generally indicated by reference numeral 10a, an annular megasonic plate 30a is provided around the optical transfer water immersion chamber 18. The exposure apparatus 10a can be operated according to the flow diagram of FIG. 3A, wherein the annular megasonic plate 30a is operated after the exposure liquid 32 is distributed into the optical transfer water immersion chamber 18 and then turned off prior to the exposure step; according to the flow diagram of FIG. 3B, wherein the annular megasonic plate 30a remains on during distribution of the exposure liquid 32 into the optical transfer water immersion chamber 18 and throughout the exposure process; or according to the flow diagram of FIG. 3C, wherein the annular megasonic plate 30a is turned on intermittently during the exposure step. In any case, the exposure liquid 32 contained in the optical transfer chamber 18 is substantially devoid of microbubbles which could otherwise distort the circuit pattern image transmitted to the wafer 34 during the exposure step.

While the preferred embodiments of the invention have been described above, it will be recognized and understood that various modifications can be made in the invention and the appended claims are intended to cover all such modifications which may fall within the spirit and scope of the invention.

What is claimed is:

1. A megasonic immersion lithography exposure apparatus comprising:
   an optical transfer chamber for containing an exposure liquid;
   at least one megasonic plate for propagating sonic waves through the exposure liquid;
   an optical system provided adjacent to said optical transfer chamber for projecting light through said exposure liquid and onto a wafer; and
   an inlet conduit provided in fluid communication with the optical transfer chamber for distributing the exposure liquid into the optical transfer chamber and wherein at least a portion of the sonic waves are propagated to the exposure liquid.

2. The apparatus of claim 1 wherein said optical system comprises a laser for emitting a laser beam through the mask and a lens for receiving a circuit pattern image from the mask and transmitting the circuit pattern image through said exposure liquid and onto the wafer.

3. A megasonic immersion lithography exposure apparatus comprising:
   an optical transfer chamber for containing an exposure liquid;
   at least one megasonic plate operably engaging said optical transfer chamber for propagating sonic waves through the exposure liquid, wherein said at least one megasonic plate comprises a generally annular megasonic plate provided around said optical transfer chamber; and
   an optical system provided adjacent to said optical transfer chamber for projecting light through a mask and said exposure liquid and onto a wafer.

4. The apparatus of claim 3 wherein said optical system comprises a laser for emitting a laser beam through the mask and a lens for receiving a circuit pattern image from the mask and transmitting the circuit pattern image through said exposure liquid and onto the wafer.

5. The apparatus of claim 1 further comprising an outlet conduit provided in fluid communication with said optical transfer chamber for distributing the exposure liquid from said optical transfer chamber.

6. The apparatus of claim 5 wherein said optical system comprises a laser for emitting a laser beam through the mask and a lens for receiving a circuit pattern image from the mask and transmitting the circuit pattern image through said exposure liquid and onto the wafer.

7. A method of removing microbubbles from an exposure liquid in an immersion lithography process, comprising the steps of:
   providing a mask having a circuit pattern;
   providing an exposure liquid through an inlet conduit;
   propagating sonic waves through said exposure liquid at said inlet conduit; and
   exposing a photoresist-coated wafer by transmitting a laser beam through said mask and said exposure liquid, respectively, onto the wafer.

8. The method of claim 7 wherein said propagating sound waves through said exposure liquid comprises propagating sound waves through said exposure liquid prior to said exposing a photoresist-coated wafer.

9. A method of removing microbubbles from an exposure liquid in an immersion lithography process, comprising the steps of:
   providing a mask having a circuit pattern;
   providing an exposure liquid;
   propagating sonic waves through said exposure liquid; and
   exposing a photoresist-coated wafer by transmitting a laser beam through said mask and said exposure liquid, respectively, onto the wafer,
   wherein said propagating sound waves through said exposure liquid comprises propagating sound waves through said exposure liquid during said exposing a photoresist-coated wafer.

10. The method of claim 7 wherein said exposure liquid comprises a mixture of ammonia, hydrogen peroxide and water.

11. The method of claim 7 wherein said exposure liquid comprises deionized water.

12. The method of claim 7 wherein said exposure liquid comprises ozonated water.

13. A method of removing microbubbles from an exposure liquid in an immersion lithography process, comprising:
   providing a mask having a circuit pattern;
   providing an exposure liquid including a surfactant;
   propagating sonic waves through said exposure liquid; and
   exposing a photoresist-coated wafer by transmitting a laser beam through said mask and said exposure liquid, respectively, onto the wafer.

14. The method of claim 7 wherein said propagating sound waves through said exposure liquid comprises propagating sound waves through said exposure liquid at a megasonic power of about 10 kHz to about 1,000 kHz.

15. A method of removing microbubbles from an exposure liquid in an immersion lithography process, comprising the steps of:
   providing a megasonic immersion lithography exposure apparatus comprising an optical system, an optical transfer chamber provided adjacent to said optical system and at least one megasonic plate engaging said optical transfer chamber;
   providing a mask having a circuit pattern in said optical system;
   providing an exposure liquid in said optical transfer chamber through an inlet conduit in fluid communication with said optical transfer chamber;
   propagating sound waves through said exposure liquid by operation of said at least one megasonic plate that is carried by the inlet conduit; and
   exposing a photoresist-coated wafer by transmitting a laser beam from said optical system, through said mask and said exposure liquid, respectively, onto the wafer.

16. The method of claim 15 wherein said propagating sound waves through said exposure liquid comprises propagating sound waves through said exposure liquid prior to said exposing a photoresist-coated wafer.

17. The method of claim 15 wherein said propagating sound waves through said exposure liquid comprises propagating sound waves through said exposure liquid during said exposing a photoresist-coated wafer.

18. The method of claim 15 wherein said propagating sound waves through said exposure liquid comprises intermittently propagating sound waves through said exposure liquid during said exposing a photoresist-coated wafer.

19. An immersion lithography process, comprising the steps of:
   providing a megasonic immersion lithography exposure apparatus comprising an optical system, an optical transfer chamber provided between to said the last objective lens of the optical system and the substrate, at least one megasonic plate engaging said optical transfer chamber;

providing a mask having a circuit pattern;

providing a first liquid into the optical transfer chamber;

propagating sonic waves through said first liquid;

providing a second liquid into the optical transfer chamber;

exposing a photoresist-coated wafer by transmitting a optical beam through said optical system and said second liquid, respectively, onto the wafer.

20. The method of claim 19 wherein said propagating sound waves through said first liquid comprises propagating sound waves through said first liquid prior to said exposing a photoresist-coated wafer.

21. The method of claim 19 wherein said propagating sound waves through said first liquid comprises propagating sound waves through said second liquid during said exposing a photoresist-coated wafer.

22. The method of claim 19 wherein said first liquid comprises a mixture of ammonia, hydrogen peroxide and water.

23. The method of claim 19 wherein said first liquid comprises deionized water.

24. The method of claim 19 wherein said first liquid comprises ozonated water.

25. The method of claim 19 further comprising a surfactant provided in said first liquid.

26. The method of claim 19 wherein said second liquid comprises DI water.

27. The method of claim 19 wherein said second liquid comprises surfactant.

28. The method of claim 19 wherein said propagating sound waves through said first liquid comprises propagating sound waves through said first liquid at a megasonic power of about 10 kHz to about 1,000 kHz.

29. The method of claim 19 wherein said propagating sound waves through said second liquid comprises propagating sound waves through said second liquid at a megasonic power of about 10 kHz to about 1,000 kHz.

30. An immersion lithography process, comprising:

providing a substrate into an immersion lithography system;

providing a fluid through an inlet conduit;

propagating sonic waves toward the fluid at the inlet conduit; and exposing the substrate by transmitting radiation through the immersion lithography system, through the fluid, and towards the substrate.

31. The immersion lithography process of claim 30 wherein the sonic waves are propagated toward the fluid while the substrate is being exposed.

* * * * *